United States Patent
Wittmann et al.

(10) Patent No.: US 10,693,088 B2
(45) Date of Patent: Jun. 23, 2020

(54) METHOD FOR PRODUCING AN OPTOELECTRONIC DEVICE, AND AN OPTOELECTRONIC DEVICE PRODUCED BY THE METHOD

(71) Applicant: OSRAM OLED GmbH, Regensburg (DE)

(72) Inventors: Sebastian Wittmann, Regensburg (DE); Arne Fleissner, Regensburg (DE); Erwin Lang, Regensburg (DE); Nina Riegel, Tegernheim (DE)

(73) Assignee: OSRAM OLED GMBH, Regensburg (DE)

(*) Notice: Subject to any disclaimer, the term of this patent is extended or adjusted under 35 U.S.C. 154(b) by 122 days.

(21) Appl. No.: 15/786,643

(22) Filed: Oct. 18, 2017

(65) Prior Publication Data
US 2018/0106436 A1 Apr. 19, 2018

(30) Foreign Application Priority Data
Oct. 19, 2016 (DE) ............ 10 2016 119 906

(51) Int. Cl.
*H01L 51/56* (2006.01)
*H01L 51/00* (2006.01)
*H01L 51/52* (2006.01)

(52) U.S. Cl.
CPC ...... *H01L 51/0097* (2013.01); *H01L 51/5246* (2013.01); *H01L 51/5253* (2013.01);
(Continued)

(58) Field of Classification Search
CPC ............ H01L 51/0097; H01L 51/5225; H01L 51/5218; H01L 51/5209; H01L 51/5253;
(Continued)

(56) References Cited

U.S. PATENT DOCUMENTS

| 2009/0124062 A1* | 5/2009 | Yamazaki | ......... G02F 1/133305 438/457 |
| 2014/0072771 A1* | 3/2014 | Xie | ..................... B32B 37/1207 428/174 |

(Continued)

FOREIGN PATENT DOCUMENTS

JP 2001118680 A 4/2001

OTHER PUBLICATIONS

German Search Report based on application No. 102016119906.0 (9 pages) dated Oct. 16, 2017 (for reference purpose only).
(Continued)

*Primary Examiner* — Brigitte A Paterson
(74) *Attorney, Agent, or Firm* — Viering, Jentschura & Partner MBB

(57) ABSTRACT

In various embodiments, a method for producing an optoelectronic device is provided. The method may include in the following order: providing a substrate, having a first state having a non-planar shape, reshaping the substrate into a second state. The second state has a planar or substantially planar shape. The method may further include forming at least one optoelectronic component on the substrate and reshaping the substrate into a third state. The third state is identical or substantially identical to the first state.

15 Claims, 3 Drawing Sheets

(52) U.S. Cl.
CPC .......... *H01L 51/56* (2013.01); *H01L 51/5209* (2013.01); *H01L 51/5225* (2013.01); *H01L 2251/5338* (2013.01); *H01L 2251/5361* (2013.01); *H01L 2251/56* (2013.01)

(58) Field of Classification Search
CPC ................. H01L 51/5246; H01L 51/56; H01L 2251/5361; H01L 2251/5338; H01L 2251/56
See application file for complete search history.

(56) References Cited

U.S. PATENT DOCUMENTS

| | | |
|---|---|---|
| 2015/0171354 A1 | 6/2015 | Lee et al. |
| 2016/0081180 A1* | 3/2016 | Huitema ............. H01L 51/0097 361/749 |
| 2016/0299283 A1 | 10/2016 | Yu et al. |

OTHER PUBLICATIONS

M.P. Gaj et al., "Organic light-emitting diodes on shape memory polymer substrates for wearable electronics", Organic Electronics, 2015, 151-155 pages.

* cited by examiner

METHOD FOR PRODUCING AN OPTOELECTRONIC DEVICE, AND AN OPTOELECTRONIC DEVICE PRODUCED BY THE METHOD

CROSS-REFERENCE TO RELATED APPLICATION

This application claims priority to German Patent Application Serial No. 10 2016 119 906.0, which was filed Oct. 19, 2016, and is incorporated herein by reference in its entirety.

TECHNICAL FIELD

Various embodiments relate generally to a method for producing an optoelectronic device, and to an optoelectronic device produced by the method.

BACKGROUND

Optoelectronic components on an organic basis, so-called organic optoelectronic components, are finding increasingly widespread application. By way of example, organic light emitting diodes (OLEDs) are increasingly making inroads into general lighting, for example as surface light sources. An optoelectronic component including an organic light emitting diode as emission unit includes a multiplicity of (organic) layers. Nowadays there is growing interest in OLED luminous surfaces or OLED displays having a 3D appearance.

In order to impart a permanent 3D or 2.5D appearance to OLED luminous surfaces or OLED displays, these are generally applied on a correspondingly 3D-shaped holder composed of plastic or metal, for example by an adhesive. In this case, 2.5D appearance is understood to mean a two-dimensional area having depth information.

For fixing the OLED luminous surfaces or OLED displays on said 3D-shaped holder by means of said method, an expenditure of force is necessary in order to overcome the restoring forces of the holder. Said force is exerted inter alia by way of pressure on the active area of the OLED, which can lead to defects in the OLED. The pressure can for example cause particle contaminations to be impressed into the organic layers of the OLED, which can in turn lead to a short circuit and a failure of the OLED component.

In order to produce OLED luminous surfaces or OLED displays having a 3D or 2.5D appearance, it is furthermore known to fix the OLEDs temporarily, for example by vacuum, on a negative mould, followed by adhesive bonding of the OLEDs into the actual mould (positive mould) by an adhesive. During the curing of the adhesive, the OLEDs are fixed between the mould and the negative mould.

SUMMARY

In various embodiments, a method for producing an optoelectronic device is provided. The method may include in the following order: providing a substrate, having a first state having a non-planar shape, reshaping the substrate into a second state. The second state has a planar or substantially planar shape. The method may further include forming at least one optoelectronic component on the substrate and reshaping the substrate into a third state. The third state is identical or substantially identical to the first state.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIGS. 1A to 4D show schematic sectional illustrations concerning a method for producing an optoelectronic device in accordance with various embodiments;

FIG. 2 shows a schematic cross-sectional view of an optoelectronic component in accordance with various embodiments;

FIGS. 4A to 4D show schematic sectional illustrations concerning a method for producing an optoelectronic device in accordance with various embodiments.

DESCRIPTION

Figure 1A:
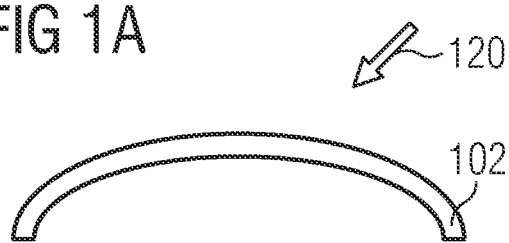

The following detailed description refers to the accompanying drawings that show, by way of illustration, specific details and embodiments in which the invention may be practiced.

The word "exemplary" is used herein to mean "serving as an example, instance, or illustration". Any embodiment or design described herein as "exemplary" is not necessarily to be construed as preferred or advantageous over other embodiments or designs.

In the following detailed description, reference is made to the accompanying drawings, which form part of this description and show for illustration purposes specific embodiments in which the invention can be implemented. Since component parts of embodiments can be positioned in a number of different orientations, the direction terminology serves for illustration and is not restrictive in any way whatsoever. It goes without saying that other embodiments can be used and structural or logical changes can be made, without departing from the scope of protection of the present invention. It goes without saying that the features of the various embodiments described herein can be combined with one another, unless specifically indicated otherwise. Therefore, the following detailed description should not be interpreted in a restrictive sense, and the scope of protection of the present invention is defined by the appended claims. In the figures, identical or similar elements are provided with identical reference signs, in so far as this is expedient.

In the context of this description, the terms "connected" and "coupled" are used to describe both a direct and an indirect connection and a direct or indirect coupling. In the figures, identical or similar elements are provided with identical reference signs, in so far as this is expedient.

In the context of this description, an optoelectronic device is understood to mean an optoelectronic assembly including one, two or more optoelectronic components. The optoelectronic device can be formed for example as a display or a luminous module.

In the context of this description, an optoelectronic component can be understood to mean a component which emits or absorbs electromagnetic radiation by means of a semiconductor component.

An electromagnetic radiation absorbing component can be for example a solar cell or a photodetector.

In various embodiments, an electromagnetic radiation emitting component can be an electromagnetic radiation emitting semiconductor component and/or can be formed as an electromagnetic radiation emitting diode, as an organic electromagnetic radiation emitting diode, as an electromagnetic radiation emitting transistor or as an organic electromagnetic radiation emitting transistor. The radiation can be for example light in the visible range, UV light and/or infrared light. In this context, the electromagnetic radiation emitting component can be formed for example as a light emitting diode (LED), as an organic light emitting diode (OLED), as a light emitting transistor or as an organic light emitting transistor. In various embodiments, the light emitting component can be part of an integrated circuit. Furthermore, a plurality of light emitting components can be provided, for example in a manner accommodated in a common housing.

An organic optoelectronic component includes an organic functional layer system, which is also referred to synonymously as an organic functional layer structure. The organic functional layer structure includes or is formed from an organic substance or an organic substance mixture that is configured for example for providing an electromagnetic radiation from an electric current provided or for providing an electric current from an electromagnetic radiation provided. The radiation can be for example light in the visible range, UV light and/or infrared light. An organic light emitting diode is formed as a so-called top emitter and/or a so-called bottom emitter. In the case of a bottom emitter, electromagnetic radiation is emitted from the electrically active region through the substrate. In the case of a top emitter, electromagnetic radiation is emitted from the top side of the electrically active region and not through the substrate.

The term "shape memory material" is understood to mean a material that has the property of having a shape different from its original shape temporarily or reversibly after a mechanical deformation, for example an elastic deformation, and of assuming its original shape again by means of an external stimulus. The shape memory material can be reshaped and embossed in such a way that specific configurations and changes in shape of the shape memory material can be maintained. The phenomenon of the shape memory property is a function of the material as such which the material acquires after suitable steps, for example after reshaping of the shape memory material above the transition temperature of the shape memory material and rapid cooling of the shape memory material.

The term "permanent shape" of the shape memory material (permanent form) is a term specific to shape memory material. This involves a shape of the shape memory material which is retained in the memory of the shape memory material. The shape memory material is embossed with the permanent shape, for example after reshaping of the shape memory material into a shape above the transition temperature of the shape memory material and rapid cooling of the shape memory material. The permanent shape can also be referred to as the original shape of the shape memory material. After reshaping of the shape memory material embossed with the permanent shape, the shape memory material is reshaped back into the permanent shape by means of a stimulus. In various embodiments in which the substrate is formed from or includes shape memory material, the permanent shape is also understood as the first state of the substrate.

The term "temporary shape" of the shape memory material is a term specific to shape memory material. This involves the shape of the shape memory material which is different from the permanent shape of the shape memory material. The temporary shape of the shape memory material can be obtained for example after reshaping of the substrate having the permanent shape, for example by means of a mechanical deformation, for example an elastic deformation of the shape memory material. The temporary shape of the shape memory material is a shape that is reversible to the permanent shape of the shape memory material. The temporary shape can also be referred to as temporary form. In various embodiments in which the substrate is formed from or includes shape memory material, the temporary shape is also understood as the second state of the substrate.

In the context of this description, an external stimulus can be understood to mean an alteration of a physical parameter or of the value of a physical variable, which initiate the shape memory effect in the case of a predefined shape memory material. A stimulus for a multiplicity of different shape memory materials is for example an alteration of the temperature above a specific switching temperature (also referred to as transition or limit temperature). Such a switching temperature is for example the glass transition temperature or the melting point of the shape memory material. Alternatively or additionally, an irradiation with light of a predefined wavelength, for example by means of UV light, can initiate a crosslinking of the shape memory material. Further stimuli may be an alteration of a magnetic field or an alteration of a mechanical stress.

In the context of this description, a 3D appearance of the optoelectronic device can be understood to mean that the spatial representation of an image of the optoelectronic device is three-dimensional. In the context of this description, a 2.5D appearance of the optoelectronic device can be understood to mean that the spatial representation of an image of the optoelectronic device is two-dimensional with additional depth information.

In the context of this description, a neutral axis of an optoelectronic component or an optoelectronic device can be understood to mean that region of the layer cross section which is not subject to extension or compression upon bending, i.e. upon exertion of tensile forces and compressive forces on the cross section.

In the bending region, the substance or the substance mixture can be extended at the outer side of the layer cross section with respect to the bending edge, while the substance or the substance mixture is compressed at the inner edge.

The position of the neutral axis in the layer cross section of the optoelectronic component may be dependent on the moduli of elasticity of the layers in the layer cross section. The neutral axis may also be referred to as neutral phase.

In the context of this description, the term "reactive" is used to describe a property of the media, compounds or additives of being able to be converted in a reaction with the components of the polymer which lead to chemical or physical network points or crosslinked points in and with the polymer. This can be carried out by means of an irradiation or treatment, for example a thermal treatment, for example a heating, an IR irradiation, an irradiation with γ-radiation, an irradiation with β-radiation, a magnetic and/or electric field, a UV light.

Various embodiments provide a cost-effective, simple method for producing an optoelectronic device including at least one optoelectronic component, said optoelectronic device having a 3D or 2.5D appearance, wherein the method prevents or avoids an occurrence of defects in the at least one optoelectronic component of the optoelectronic device during the production of the optoelectronic device.

The method which prevents or avoids defects in the optoelectronic components of the optoelectronic device should alternatively or additionally be carried out in such a way that, for reshaping the optoelectronic device having a 3D or 2.5D appearance, no external forces on the active area are necessary, for example no or substantially no mechanical pressure is exerted on the active area.

Various embodiments provide an optoelectronic device produced by the method, the shape of which optoelectronic device reproduces a 3D or 2.5D appearance that is free or substantially free of compressions and/or extensions.

In various aspects, a method for producing an optoelectronic device is provided. The method includes providing a substrate. The substrate has a first state having a non-planar shape. The method furthermore includes reshaping the substrate into a second state. The second state has a planar or substantially planar shape. The method furthermore includes forming at least one optoelectronic component on the substrate. The method furthermore includes reshaping the substrate into a third state. The third state is identical or substantially identical to the first state.

This has the effect that the at least one optoelectronic component can be formed on a planar or substantially planar substrate, which simplifies the process and method conditions. Moreover, the method has the effect that the optoelectronic component on the substrate can be reshaped into a non-planar shape, i.e. into a 3D or 2.5D appearance, in a simple manner. This prevents a pressure, i.e. a mechanical loading, from acting directly on the at least one optoelectronic component, for example the encapsulation structure thereof.

The optoelectronic component is formed on a surface of the substrate. That surface of the substrate on which the optoelectronic component is formed can be a planar surface, for example having a low roughness. A low roughness includes for example a mean roughness in a range of approximately 0.1 nm to approximately 50 nm. However, at the microscopic and/or macroscopic level, the substrate and/or the surface of the substrate can moreover be non-planar, for example have an undulation, a curvature or a bend, for example having a convexly curved shape. Hereinafter, the microscopic and/or macroscopic planarity of the substrate and/or of the surface of the substrate is meant when the planar and/or non-planar substrate and/or surface of the substrate is described.

In the process of forming the at least one optoelectronic component, the surface of the substrate has a planar shape. This has the effect that the at least one optoelectronic component can be formed on a planar or substantially planar surface of the substrate, which simplifies the process and method conditions.

In the context of this description, the term "non-planar shape" is used with the meaning that the shape in the surface has at least one bend or a curvature. The non-planar surface is the surface on which the at least one optoelectronic component is applied or formed after the process of reshaping the non-planar surface of the substrate into a planar or substantially planar surface of the substrate. By way of example, the substrate in the first state includes two coplanar surfaces having a bend or a curvature. In the first state, the substrate can inherently have at least one bend or one curvature. By way of example, the substrate is formed as a film or a sheet. By way of example, the substrate was wound up on a roll and has a curvature from this winding-up. In this respect, the substrate is non-planar or non-level or not flat.

The term "substrate" is used herein with the meaning that a carrier is involved on which at least one optoelectronic component can be formed, i.e. is deposited or applied. A molten material, for example a moulding compound, is not a substrate in this sense. However, a substrate can be formed from the molten material, for example by the molten material being brought to a predefined shape and solidified.

In one development, the non-planar shape has at least one curvature or one bend. Illustratively, the substrate thus has a shape that leads to a 3D or 2.5D appearance of the optoelectronic device.

In another development, the substrate includes a shape memory material. This has the effect that the substrate is formed, for example is embossed, in a shape that it can assume again after a mechanical deformation, for example an elastic deformation by means of an external stimulus.

In another development, the shape memory material includes a metallic alloy or at least one polymer. For the case where the shape memory material includes a metallic alloy, this has the effect that the heat arising during operation in the optoelectronic device is dissipated or distributed uniformly. For the case where the shape memory material includes a polymer, what is made possible is that the optoelectronic device can be recycled in a simple manner.

In another development, reshaping the substrate from the first state into the second state includes a phase transition of the shape memory material. The phase transition is for example a discontinuous phase transition, a martensitic phase transition or a continuous phase transition. This has the effect that the shape memory material, by means of the phase transition of the shape memory material, has stable phases in the second state. This enables a stabilization of the substrate in the second state.

In another development, in the process of providing the substrate, the substrate is formed in a non-planar fashion, i.e. intrinsically has a non-planar shape. Alternatively, the substrate is formed in a planar fashion and is brought to the non-planar shape, for example by means of a shape embossing. This enables the shape memory material of the substrate to be embossed with a permanent shape that is non-planar.

In another development, reshaping the substrate from the first state into the second state includes mechanical reshaping. The mechanical reshaping thereby brings about a mechanical deformation, for example an elastic deformation of the substrate, for example of the substrate including shape memory material.

In another development, reshaping the substrate from the first state into the second state includes a fixing in the second state by means of a releasable, mechanical connection, for example by means of a clamping, for example with a clamp or clamping connection. The releasable, mechanical connection is formed by means of a connection means or a connection structure, for example by the substrate being arranged and clamped between a holder and a clamp. Alternatively or additionally, reshaping the substrate from the first state into the second state includes a fixing by means of at least one property of the shape memory material. This has the effect that the substrate is stable and/or stabilized with a flat or planar surface on which the at least one optoelectronic component can be formed in a simple, stable, practical manner. This furthermore makes it possible to form or fix the at least one optoelectronic component on the substrate 102, wherein forming the at least one optoelectronic component on the substrate 102 is free of external forces on the at least one optoelectronic component.

In one development, the releasable, mechanical connection includes at least one clamp. The at least one clamp includes a shape memory material. The at least one clamp including shape memory material enables the stabilization of the substrate in the planar or substantially planar shape.

In another development, forming the at least one optoelectronic component on the substrate includes a lamination of the at least one optoelectronic component on the substrate. This brings about a cohesive bonding of the at least one optoelectronic component to the substrate. Alternatively or additionally, forming the at least one optoelectronic component on the substrate includes at least forming a first electrode on the substrate, forming an organic functional layer stack on the first electrode and forming a second electrode on the organic functional layer stack. This brings about a more cost-effective process of forming the plurality of optoelectronic components including a common substrate.

In another development, reshaping the substrate from the second state into the third state includes releasing the releasable, mechanical connection, for example removing at least one clamp. Alternatively or additionally, reshaping the substrate from the second state into the third state includes a further phase transition of the shape memory material, for example by means of a stimulus. In this case, the substrate and/or the connection means may include the shape memory material. This makes it possible to reshape the optoelectronic device or the substrate of the optoelectronic device into a non-planar, for example convexly curved, shape, without the need for an external force, for example a pressure, i.e. a mechanical loading on the optoelectronic component, for example on the active area of the at least one optoelectronic component or the encapsulation layer thereof.

In another development, reshaping the substrate from the second state into the third state includes reshaping the at least one clamp including shape memory material, for example by means of a stimulus. The at least one clamp including shape memory material makes it possible to support or protect the edge region of the optoelectronic device during the process of reshaping the substrate into the third state. This has the effect of reducing or avoiding a delamination of the at least one optoelectronic component from the substrate during the process of reshaping the substrate into the third state.

In another development, the method after forming the at least one optoelectronic component on the substrate furthermore includes forming an encapsulation layer. Forming the encapsulation layer and reshaping the substrate into the third state can be carried out simultaneously. Forming the encapsulation layer after forming the at least one optoelectronic component on the substrate and before reshaping the substrate into the third state can bring about a stabilized process of reshaping the substrate into the third state. A delamination of the at least one optoelectronic component from the substrate is reduced or avoided as a result.

In a further aspect, a method for producing an optoelectronic device is provided. The method includes providing a first substrate and a second substrate. The first substrate and the second substrate are provided in each case in a non-planar shape, i.e. are formed intrinsically in a non-planar fashion. Alternatively, the first substrate and the second substrate are brought from a planar shape to the non-planar shape, for example by means of a shape embossing of the planar shape.

The method furthermore includes reshaping the first substrate and the second substrate in each case into a planar or substantially planar shape.

The method furthermore includes forming at least one optoelectronic component on the first substrate having the planar shape or having the substantially planar shape or on the second substrate having the planar shape or having the substantially planar shape. The at least one optoelectronic component is formed, for example arranged, in a sandwich-like manner between the first substrate and the second substrate.

The method furthermore includes reshaping the first substrate having the planar shape or having the substantially planar shape and the second substrate having the planar shape or having the substantially planar shape in each case to a non-planar shape.

The arrangement of the at least one optoelectronic component between a first substrate and a second substrate makes it possible, during the process of reshaping the first substrate and the second substrate into the non-planar shape, for example during the process of reshaping the optoelectronic device into the convexly curved shape, for the at least one optoelectronic component to be formed in the neutral axis or in the region of the neutral axis. This enables an optoelectronic device having a 3D or 2.5D appearance, wherein at least one optoelectronic component is free or substantially free of compression or extension. The mechanical loading of the optoelectronic component is reduced as a result.

In one development, an optoelectronic device is provided. The optoelectronic device includes a first substrate having a first non-planar shape, a second substrate having a second non-planar shape and at least one optoelectronic component. The optoelectronic component is arranged in a sandwichlike manner between the first substrate and the second substrate. The first substrate includes a first shape memory material and the second substrate includes a second shape memory material. The first shape memory material can be identical to or different from the second shape memory material. The second non-planar shape is identical or substantially identical to the first non-planar shape. The first substrate is arranged in a coplanar or substantially coplanar fashion with respect to the second substrate.

This makes it possible that the at least one optoelectronic component can be arranged in the neutral axis or in the region of the neutral axis. This brings about an optoelectronic device having a 3D or 2.5D appearance, wherein the mechanical loading of the optoelectronic component by compression or extension is reduced or avoided.

In various developments, the optoelectronic device and its component parts, for example the at least one optoelectronic component and the first and second substrates, have the same features as the optoelectronic device implemented in the method, and vice versa.

FIG. 1 shows a schematic sectional illustration concerning a method for producing an optoelectronic device in accordance with various embodiments.

The method for producing an optoelectronic device includes providing 120 a substrate 102, reshaping 140 the substrate 102 into a second state, forming 160 at least one optoelectronic component 104 on the substrate 102, and reshaping 180 the substrate 102 into a third state.

In the process of providing 120 the substrate 102, the substrate 102 has a first state. The first state has a non-planar shape. In other words: the substrate has a non-planar shape in the first state. For the case where the substrate includes a shape memory material, the first state constitutes the state of the substrate in which the substrate has the permanent shape.

The second state has a planar or substantially planar shape. In other words: the substrate has a planar or substantially planar shape in the second state. In this case, the planar or substantially planar shape relates substantially to that surface of the substrate on which the optoelectronic component is formed. For the case where the substrate includes a shape memory material, the second state constitutes the state of the substrate in which the substrate has the temporary shape.

The third state is identical or substantially identical to the first state. In other words: in the third state, the substrate has a non-planar shape which is identical or substantially identical, for example similar, to the non-planar shape in the first state, i.e. is derivable from this shape, or corresponds thereto. For the case where the substrate includes a shape memory material, the third state constitutes the state of the substrate in which the substrate, after reshaping of the substrate having the temporary shape, has the permanent shape or a shape identical to the permanent shape.

The method for producing an optoelectronic device makes it possible to form the at least one optoelectronic component on a substrate shaped in a planar or substantially planar fashion. After the process of forming the at least one optoelectronic component, the optoelectronic device is reshaped into the third state in such a way that the optoelectronic device has a non-planar shape, for example a convexly curved shape. This makes it possible to produce an optoelectronic device which has a 3D or 2.5D appearance. By means of reshaping the substrate with the at least one optoelectronic component, an optoelectronic device having a non-planar shape is provided in a simple manner. This prevents a pressure, i.e. a mechanical loading, from acting directly on the at least one optoelectronic component, for example the encapsulation structure thereof. As a result, it is possible to reduce or avoid previously occurring defects in the at least one optoelectronic component during the process of forming the latter on the substrate.

FIG. 1A illustrates the process of providing 120 the substrate 102 in the method for producing the optoelectronic device 101 in accordance with various embodiments.

In various embodiments, the non-planar shape has at least one curvature and/or one bend. In the context of this description, a curvature may include or be a flexure, a curve, an inflection, or the like. In the context of this description, a bend may include or be a fold or the like. A radius of curvature that quantifies the degree of (non-) planarity is defined for a curvature. No radius of curvature is defined for a bend since the bend involves a discontinuity of the course of the shape.

In other words: in the process of providing 120 the substrate and/or in the process of reshaping 180 the substrate from the second state into the third state, the substrate 102 is formed in such a way that it has a curvature and/or a bend. This makes it possible to form an optoelectronic device having a 3D or 2.5D appearance, without the optoelectronic component being damaged by the reshaping process in this case.

The substrate 102 is for example a film or a holder for the optoelectronic device 101. Alternatively or additionally, the substrate 102 is for example the substrate of the at least one optoelectronic component 104, for example the common substrate for a plurality of optoelectronic components of the optoelectronic device 101.

The substrate 102 is for example an elastic substrate, a pseudoelastic substrate, a viscoelastic substrate and/or a thermoelastic substrate.

In various embodiments, the substrate 102 includes or is formed from a shape memory material. The shape memory material is for example a one-way shape memory material or a multi-way shape memory material, for example a two-way shape memory material or a three-way shape memory material.

This has the effect that the substrate is embossed with a shape that it can assume again after a mechanical deformation, for example an elastic deformation, by means of an external stimulus suitable for the shape memory material. This enables for example a simpler shipping of the optoelectronic device as a planar, thin body which can be brought to the later 3D or 2.5D structure in a very simple manner by the customer after purchase. Alternatively or additionally, it enables a self-repair of the optoelectronic device. By way of example, after manufacture of the optoelectronic device has been completed, an inadvertent mechanically induced deformation of the substrate may occur, for example an accidental mechanically induced deformation. The substrate composed of shape memory material can correct the inadvertent mechanically induced deformation by means of the external stimulus suitable for the shape memory material. Correcting the inadvertent mechanically induced deformation is understood to mean that the substrate reshaped by the inadvertent mechanically induced deformation assumes again the shape embossed in the shape memory material by means of the external stimulus.

In various embodiments, the shape memory material includes or is formed from a metallic alloy. The metallic alloy is for example a nickel-, copper-, iron-, copper-zinc-nickel-, copper-aluminium-nickel-, silver-nickel-, gold-cadmium-based alloy or combinations thereof. By way of example, the metallic alloy is a nickel-titanium- or a nickel-titanium-copper-based alloy. By way of example, the metallic alloy is a mixture of nickel and titanium in a ratio of 1:1 with regard to the atomic number (also referred to as Nitinol).

In various embodiments, the shape memory material includes or is formed from at least one polymer, for example two polymers or three polymers. The at least one polymer includes for example a copolymer and/or a combination of at least two polymer materials. The at least one polymer includes for example an elastic polymer material, a viscoelastic polymer material, a pseudoplastic polymer material, a thermoplastic polymer material and/or a thermosetting polymer material. The shape memory polymer is for example a physically crosslinked polymer or a chemically crosslinked polymer. Examples of polymers or polymer materials are polyurethane (PUR), polyamide (PA), for example nylon 6 or nylon 66, polyester, for example polyethylene terephthalate (PET), polypropylene terephthalate (PPT), polycarbonate (PC), acrylic butadiene styrene (ABS), vinyl polymer or polyolefin, for example polystyrene (PS), poly(1,4-butadiene), copolymer of polystyrene with poly(1,4-butadiene), polyvinyl chloride (PVC), polyvinylpyrrolidone (PVP), polyacrylonitrile (PAN), polyethylene (PE), polypropylene (PP), polyethylene oxide (PEO), polyether, poly(2-methyl-2-oxazoline), polytetrahydrofuran, copolymer of poly(2-methyl-2-oxazoline) with polytetrahydrofuran, polyethylene oxide (PEO), copolymer of polyethylene terephthalate (PET) with polyethylene oxide (PEO), polynorbornene, polycyanate, maleic anhydride, etc.

Optionally, the shape memory material including polymer may include additives, for example crosslinkers, reactive oligomers, reactive fillers and/or further additives, for example glycerol, trimethylolpropane, dimethyl 5-isophthalate, anti-oxidizing agents, UV absorbers, fillers, reinforcement materials, colourants, processing aids.

For the case where the shape memory material includes a metallic alloy, the heat arising during operation in the optoelectronic device is dissipated or distributed uniformly. For the case where the shape memory material includes a polymer, what is made possible is that the optoelectronic device can be recycled more simply.

Providing 120 the substrate 102 includes for example forming the substrate 102 in a non-planar fashion. By way of example, the substrate 102 is provided in such a way that it has the non-planar shape. In other words: the substrate 102 is formed in a state having a non-planar shape. Alternatively or additionally, providing 120 the substrate 102 includes firstly providing the substrate 102 having a planar or substantially planar shape followed by bringing or reshaping the substrate 102 into a state having a non-planar shape. In other words: the substrate 102 is formed in a planar fashion and is brought to the non-planar shape. By way of example, changing the state of the substrate 102 from the planar shape to the non-planar shape is carried out by means of a shape embossing. In other words: the planar substrate 102 can be shape-embossed in such a way that it has a non-planar shape. Furthermore, the shape embossing can proceed in a convexly curved fashion. Alternatively or additionally, the shape embossing can have a bend. Furthermore, the shape embossing is carried out for example at a temperature in a range of approximately 300° C. to approximately 600° C., for example of approximately 400° C. to approximately 500° C.

This has the effect that the substrate is embossed with a non-planar shape corresponding to the first state. This makes it possible that the substrate having the embossed non-planar shape can be reshaped to a different shape by means of a mechanical stress and, after relief of the mechanical stress, the substrate can be reshaped to a shape that is identical or substantially identical to the non-planar shape corresponding to the first state.

For the case where the substrate 102 includes a shape memory material, providing 120 the substrate 102 includes embossing the shape memory material with a permanent shape, for example reshaping the shape memory material to a shape above the transition value of the shape memory material, for example the transition temperature of the shape memory material, and rapidly cooling the shape memory material. The substrate 102 is embossed with the permanent shape as a result. The permanent shape of the substrate is a non-planar shape, for example a convexly curved shape. In this case, the substrate including shape memory material has the first state, i.e. a non-planar shape, for example a convexly curved shape.

Embossing the shape memory material of the substrate with the permanent shape makes it possible for the substrate to be shaped back into the first state and/or to the permanent shape after reshaping of the substrate into a different state and/or into a temporary shape, for example by means of a mechanical deformation, for example an elastic deformation, by means of a stimulus, for example a change of the value of a physical variable above the transition value of the shape memory material, for example the transition temperature of the shape memory material.

Figure 1B:
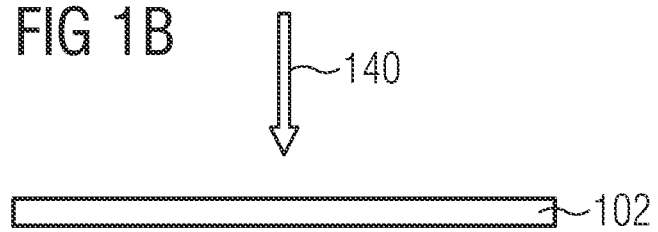

FIG. 1B illustrates a precursor of the optoelectronic device 101 in the method for producing the optoelectronic device 101 in accordance with various embodiments. The optoelectronic device can correspond to one of the optoelectronic devices described above. The substrate and the shape memory material can be formed for example in accordance with one of the embodiments described above.

As is illustrated in FIG. 1B, the substrate 102 has a planar or substantially planar shape. The planar or substantially planar shape of the substrate constitutes the second state of the substrate 102.

The substrate 102 may include a shape memory material.

In various embodiments, reshaping 140 the substrate 102 including shape memory material from the first state into the second state includes a phase transition or a phase transformation of the shape memory material.

This has the effect that the shape memory material, by means of the phase transition of the shape memory material, has stable phases in the second state. This enables a stabilization of the substrate in the second state.

If the shape memory material includes or is formed from a metallic alloy, the metallic alloy has a first crystal structure or phase at least in the first state and a second crystal structure or phase in the second state. The at least first crystal structure and second crystal structure are different. The first crystal structure is the crystal structure of the metallic alloy which is embossed in the metallic alloy with shape memory material. The first crystal structure thus constitutes the permanent shape of the metallic alloy. The second crystal structure is a structure that is obtained for example by means of a mechanical deformation, for example an elastic deformation of the metallic alloy. The second crystal structure thus constitutes the temporary shape of the metallic alloy. The metallic alloy can transform from the first crystal structure to the second crystal structure, and vice versa. By way of example, the metallic alloy transforms from the first crystal structure to the second crystal structure by means of a mechanical deformation, for example an elastic deformation, for example by means of smoothing or flattening of the substrate. By way of example, the metallic alloy transforms from the second crystal structure to the first crystal structure by means of an initiating stimulus for the metallic alloy, for example a change in the value of a physical variable above the transition value of the metallic alloy, for example above the transition temperature of the metallic alloy. The first crystal structure has one or more lattice parameters different from the lattice parameter(s) of the second crystal structure. As a result, the substrate can have a different shape in the first crystal structure compared with in the second crystal structure. A lattice parameter is a lattice constant, for example, whereby different lattice shapes can be formed in the crystal shapes.

If the shape memory material includes or is formed from a polymer or a polymer mixture, the shape memory material has at least a first molecular network structure phase and a second molecular network structure phase. The first molecular network structure phase is the molecular network structure phase of the polymer or of the polymer mixture which is embossed in the polymer or in the polymer mixture with shape memory material. The first molecular network structure phase thus constitutes the permanent shape of the polymer or of the polymer mixture. The second molecular network structure phase is a structure that is obtained for example by means of a mechanical deformation, for example an elastic deformation of the polymer or of the polymer mixture. The second molecular network structure phase thus constitutes the temporary shape of the polymer or of the polymer mixture. The at least one polymer can transform from the first molecular network structure phase to the second molecular network structure phase, and vice versa. By way of example, the polymer or the polymer mixture transforms from the molecular network structure phase to the second molecular network structure phase by means of a mechanical deformation, for example an elastic deformation, for example by means of smoothing or flattening of the substrate. By way of example, the polymer or the polymer mixture transforms from the second molecular network structure phase to the first molecular network structure phase by means of an initiating stimulus for the metallic alloy, for example a change in the value of a physical variable above the transition value of the polymer or of the polymer mixture, for example above the transition temperature of the polymer or of the polymer mixture.

Alternatively or additionally, reshaping 140 the substrate 102 from the first state into the second state includes mechanical reshaping. By way of example, the mechanical reshaping includes drawing smooth, pressing and/or rolling. Drawing smooth can be a process of drawing the sides arranged at the outermost edge region of the substrate 102. Rolling is rolling flat, for example. The mechanical reshaping thereby brings about a mechanical deformation, for example an elastic deformation of the substrate, for example of the substrate including shape memory material.

In various embodiments, reshaping 140 the substrate 102 from the first state into the second state includes a fixing. The fixing in the second state is carried out for example by means of a releasable, mechanical connection, for example a clamping. The releasable, mechanical connection includes a connection means, for example a carrier temporarily adhesively bonded on the substrate, or at least one clamp 112 (illustrated in FIG. 3A). Alternatively or additionally, the clamp can be formed as follows: a first plate and a second plate, wherein the first plate and the second plate are formed in such a way that they can be connected together, for example by means of screwing. The first plate can have a whole surface area in this case. The second plate has a single large-area cutout on the side on which the OLED is processed. Alternatively, the second plate, on the side on which the OLED is processed, has a plurality of cutouts through which the OLED(s) can be processed on the substrate. Alternatively or additionally, the fixing in the second state is carried out by means of at least one property of the shape memory material. The property of the shape memory material is material-specific, i.e. shape memory material-dependent. The property of the shape memory material is for example a structure of the at least one polymer after reshaping into the second state. Alternatively or additionally, the property of the shape memory material is a crosslinking of the at least one polymer obtained after reshaping into the second state. By virtue of the property of the shape memory material, the temporary shape of the shape memory material is stabilized at a temperature in a range of approximately −10° C. to approximately 100° C.

Reshaping the substrate to a planar shape has the effect that the substrate is stable or stabilized with a flat surface. The at least one optoelectronic component 104 can be formed in a simple, stable, practical manner on the planar surface of the substrate.

This furthermore makes it possible to form or fix the at least one optoelectronic component 104 on the substrate 102, without the optoelectronic component 104 or the active area thereof being damaged in the process by means of a pressure, i.e. a mechanical loading on the optoelectronic component 104.

Figure 1C:
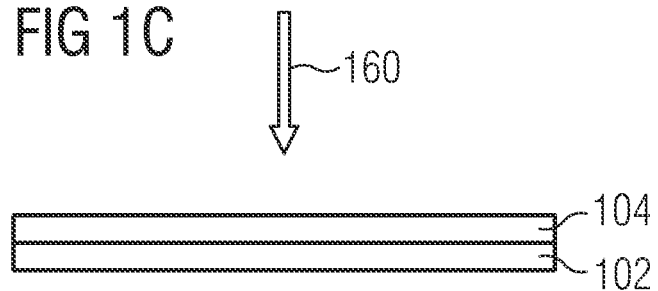

FIG. 1C illustrates a precursor of the optoelectronic device 101 in the method for producing the optoelectronic device 101 in accordance with various embodiments. The optoelectronic device can correspond to one of the optoelectronic devices described above. The substrate and the shape memory material can be formed for example in accordance with one of the embodiments described above.

As is illustrated in FIG. 1C, at least one optoelectronic component 104 is formed on the planar or substantially planar substrate 102, for example a plurality of optoelectronic components. The at least one optoelectronic component is described in greater detail below (see FIG. 2, for example).

Forming the at least one optoelectronic component 104 on the planar substrate makes it possible for a pressure, i.e. a mechanical loading, to be applied on the optoelectronic component 104, for example on the active area of the optoelectronic component 104 or the encapsulation layer thereof. This has the effect of reducing or avoiding the previously occurring defects during the process of forming the at least one optoelectronic component 104.

In various embodiments, forming 160 at least one optoelectronic component 104 on the substrate 102 includes a lamination of the at least one optoelectronic component 104 on the substrate 102. By way of example, the optoelectronic component 104 is fixed on the substrate 102 by means of heat, pressure, welding and/or adhesive bonding. The optoelectronic component is for example a finished optoelectronic component, for example encapsulated, or an optoelectronic component formed without an encapsulation layer.

Alternatively or additionally, the optoelectronic component 104 can be formed directly on the substrate 102, for example can be deposited layer by layer in physical contact with the substrate 102. Alternatively, the optoelectronic component 104 is formed for example above the substrate 102.

In other words:

Alternatively or additionally, forming 160 at least one optoelectronic component 104 on the substrate 102 includes at least forming the first electrode on the substrate 102, forming the organic functional layer stack on the first electrode, and forming the second electrode on the organic functional layer stack. In other words: the optoelectronic component 104 is formed or applied step by step or sequentially on the substrate 102. Alternatively or additionally, forming 160 at least one optoelectronic component 104 on the substrate 102 includes depositing a conductive layer on the substrate 102, said conductive layer including the first electrode of the optoelectronic component. This enables the plurality of optoelectronic components which include a common substrate to be formed more cost-effectively.

In various embodiments, the method 100 for producing the optoelectronic device 101, after forming 160 the at least one optoelectronic component 104 on the substrate 102, furthermore includes forming 170 an encapsulation layer. By way of example, forming 170 the encapsulation layer and reshaping 180 the substrate 102 in the third state are carried out simultaneously. This enables stabilized reshaping of the optoelectronic device and a better, supported encapsulation effect.

Figure 1D:
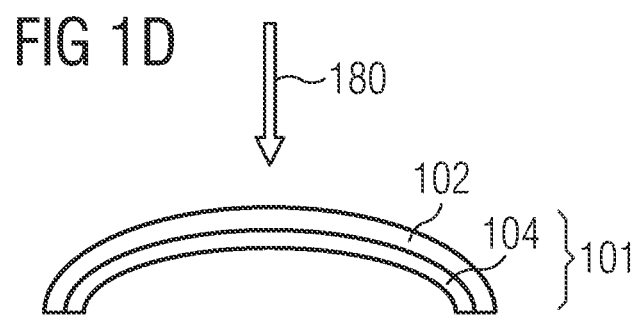

FIG. 1D illustrates the optoelectronic device 101 in the method for producing the optoelectronic device 101 in accordance with various embodiments. The optoelectronic device can correspond to one of the optoelectronic devices described above. The substrate, the shape memory material and the at least one optoelectronic component can be formed for example in accordance with one of the embodiments described above.

As is illustrated in FIG. 1D, the optoelectronic device 101 has a non-planar shape. In this case, the optoelectronic device 101 includes the substrate 102 and the at least one optoelectronic component 104 formed on the substrate 102. By way of example, a plurality of optoelectronic components 104 can be formed on a common substrate 102.

The optoelectronic device can be formed for example in such a way that it is flexible. Alternatively, the optoelectronic device can be formed for example in such a way that it is rigid or inflexible. Furthermore, the optoelectronic device is formed for example in such a way that it is transparent. Alternatively, the optoelectronic device can be formed for example in such a way that it is translucent or opaque.

The non-planar shape of the third state is the shape that is identical or substantially identical to the shape that the substrate 102 has in the first state. In other words: the substrate is reshaped into the third state in such a way that it has the same or substantially the same shape as in the first state.

In various embodiments, reshaping 180 the substrate 102 from the second state into the third state includes releasing the releasable, mechanical connection, for example relieving the mechanical stress or clamping. By way of example, releasing the releasable, mechanical connection includes removing the at least one clamp 112 from the substrate 102.

Alternatively or additionally, reshaping 180 the substrate 102 from the second state into the third state includes a further phase transition of the shape memory material. The phase transition or the phase transformation can constitute or be the opposite phase transition or the opposite phase transformation of the shape memory material of the substrate 102 with respect to the phase transition that reshapes the substrate 102 from the first state to the second state. The phase transition or the phase transformation is effected for example by means of a stimulus. The stimulus is for example an alteration of the value of a physical parameter or of a physical variable, for example the temperature, the wavelength of the UV light, the strength of the magnetic field or the mechanical stress, above a specifically defined value that initiates the phase transition or the phase transformation.

This has the effect that the substrate including shape memory material is reshaped from the temporary shape to a shape that is identical or substantially identical to the permanent shape. This enables the substrate or the optoelectronic device to be reshaped from the planar or substantially planar shape to the non-planar shape. The non-planar shape has a bend or a curvature. By way of example, the non-planar shape is a convexly curved shape. This makes it possible to obtain an optoelectronic device which reproduces a 3D or 2.5D appearance.

This furthermore enables the optoelectronic device or the substrate of the optoelectronic device to be reshaped into a non-planar or convexly curved shape, without a need for an external force, for example a pressure, i.e. a mechanical loading, on the active area of the at least one optoelectronic component.

Figure 2:
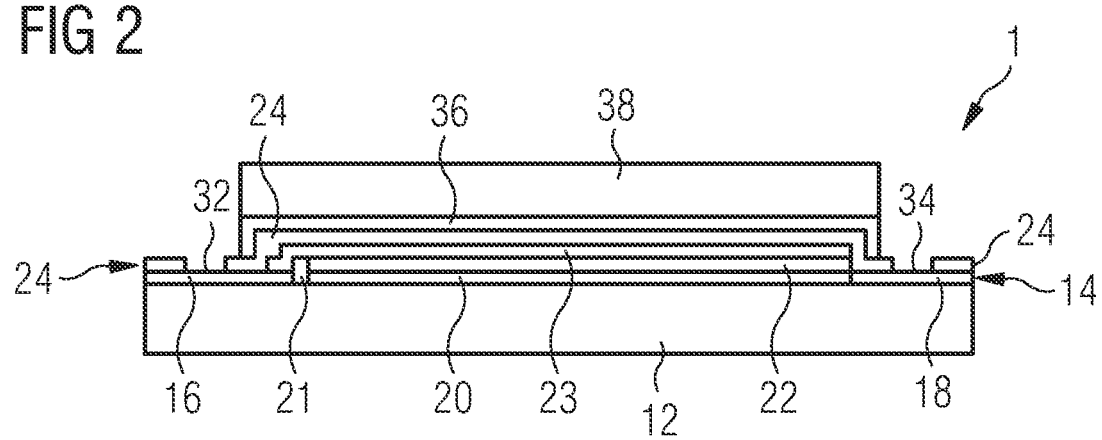

FIG. 2 illustrates a schematic cross-sectional view of an optoelectronic component in accordance with various embodiments. The optoelectronic component 1 can substantially correspond to the optoelectronic component 104 in accordance with the embodiments explained in FIG. 1.

The optoelectronic component 1 is formed for example in such a way that it is a mechanically flexible or a mechanically rigid optoelectronic component. The optoelectronic component 1 can be formed as transparent, translucent or non-transparent.

The optoelectronic component 1 includes a carrier 12. The carrier 12 can be formed as translucent or transparent. The carrier 12 serves as a carrier element for electronic elements or layers, for example light emitting elements. The carrier 12 may include or be formed from, for example, plastic, metal, glass, quartz and/or a semiconductor material. Furthermore, the carrier 12 may include or be formed from a plastics film or a laminate including one or including a plurality of plastics films. The carrier 12 can be formed as mechanically rigid or mechanically flexible. The carrier 12 can correspond to the substrate 102 in accordance with the embodiments explained in FIG. 1. Alternatively, the carrier 12 can be formed on the substrate 102 in accordance with the embodiments explained in FIG. 1.

An optoelectronic layer structure is formed on the carrier 12. The optoelectronic layer structure includes a first electrode layer 14, which includes a first contact section 16, a second contact section 18 and a first electrode 20. The carrier 12 with the first electrode layer 14 can also be referred to as a substrate. A first barrier layer (not illustrated), for example a first barrier thin-film layer, can be formed between the carrier 12 and the first electrode layer 14.

In various embodiments, the carrier 12 can correspond to the substrate 102 described. Alternatively, the carrier 12 can be fixed, for example adhesively bonded, on the substrate 102.

The first electrode 20 is electrically insulated from the first contact section 16 by means of an electrical insulation barrier 21. The second contact section 18 is electrically coupled to the first electrode 20 of the optoelectronic layer structure. The first electrode 20 can be formed as an anode or as a cathode. The first electrode 20 can be formed as translucent or transparent. The first electrode 20 includes an electrically conductive material, for example metal and/or a transparent conductive oxide (TCO) or a layer stack of a plurality of layers including metals or TCOs. The first electrode 20 may include for example a layer stack of a combination of a layer of a metal on a layer of a TCO, or vice versa. One example is a silver layer applied on an indium tin oxide layer (ITO) (Ag on ITO) or ITO-Ag-ITO multilayers. The first electrode 20 may include as an alternative or in addition to the materials mentioned: networks composed of metallic nanowires and nanoparticles, for example composed of Ag, networks composed of carbon nanotubes, graphene particles and graphene layers and/or networks composed of semiconducting nanowires.

An optically functional layer structure, for example an organic functional layer structure 22, of the optoelectronic layer structure is formed above the first electrode 20. The organic functional layer structure 22 may include for example one, two or more sublayers. By way of example, the organic functional layer structure 22 may include a hole injection layer, a hole transport layer, an emitter layer, an electron transport layer and/or an electron injection layer. The hole injection layer serves for reducing the bandgap between first electrode and hole transport layer. In the case of the hole transport layer, the hole conductivity is greater than the electron conductivity. The hole transport layer serves for transporting the holes. In the case of the electron transport layer, the electron conductivity is greater than the hole conductivity. The electron transport layer serves for transporting the electrons. The electron injection layer serves for reducing the bandgap between second electrode and electron transport layer. Furthermore, the organic functional layer structure 22 may include one, two or more functional layer structure units each including the above-mentioned sublayers and/or further intermediate layers.

A second electrode 23 of the optoelectronic layer structure is formed above the organic functional layer structure 22, which second electrode is electrically coupled to the first contact section 16. The second electrode 23 can be formed in accordance with one of the configurations of the first electrode 20, wherein the first electrode 20 and the second electrode 23 can be formed identically or differently. The first electrode 20 serves for example as an anode or a cathode of the optoelectronic layer structure. The second electrode 23, in a corresponding manner to the first electrode, serves as a cathode or an anode of the optoelectronic layer structure.

The optoelectronic layer structure is an electrically and/or optically active region. The active region is for example that region of the optoelectronic component 10 in which electric current for the operation of the optoelectronic component 10 flows and/or in which electromagnetic radiation is generated or absorbed. A getter structure (not illustrated) can be arranged on or above the active region. The getter layer can be formed as translucent, transparent or opaque. The getter layer may include or be formed from a material which absorbs and binds substances that are harmful to the active region.

An encapsulation layer 24 of the optoelectronic layer structure is formed above the second electrode 23 and partly above the first contact section 16 and partly above the second contact section 18, said encapsulation layer encapsulating the optoelectronic layer structure. The encapsulation layer 24 can be formed as a second barrier layer, for example as a second barrier thin-film layer. The encapsulation layer 24 can also be referred to as thin-film encapsulation. The encapsulation layer 24 forms a barrier with respect to chemical contaminants and/or atmospheric substances, in particular with respect to water (moisture) and oxygen. The encapsulation layer 24 can be formed as a single layer, a layer stack or a layer structure. The encapsulation layer 24 may include or be formed from: aluminium oxide, zinc oxide, zirconium oxide, titanium oxide, hafnium oxide, tantalum oxide, lanthanum oxide, silicon oxide, silicon nitride, silicon oxynitride, indium tin oxide, indium zinc oxide, aluminium-doped zinc oxide, poly(p-phenylene-terephthalamide), nylon 66, and mixtures and alloys thereof. If appropriate, the first barrier layer can be formed on the carrier 12 in a corresponding manner to a configuration of the encapsulation layer 24.

In the encapsulation layer 24, a first cutout of the encapsulation layer 24 is formed above the first contact section 16 and a second cutout of the encapsulation layer 24 is formed above the second contact section 18. A first contact region 32 is exposed in the first cutout of the encapsulation layer 24 and a second contact region 34 is exposed in the second cutout of the encapsulation layer 24. The first contact region 32 serves for electrically contacting the first contact section 16 and the second contact region 34 serves for electrically contacting the second contact section 18.

In various embodiments, the encapsulation layer is formed after the process of forming or applying the at least one optoelectronic component on or above the second electrode of the at least one optoelectronic component.

Forming the encapsulation layer between forming the at least one optoelectronic component on the substrate and reshaping the substrate into the third state can bring about stabilizing reshaping of the substrate into the third state. A delamination of the at least one optoelectronic component from the substrate is reduced or avoided as a result.

An adhesion medium layer 36 is formed above the encapsulation layer 24. The adhesion medium layer 36 includes for example an adhesion medium, for example an adhesive, for example a lamination adhesive, a lacquer and/or a resin. The adhesion medium layer 36 may include for example particles which scatter electromagnetic radiation, for example light scattering particles.

A covering body 38 is formed above the adhesion medium layer 36. The adhesion medium layer 36 serves for securing the covering body 38 on the encapsulation layer 24. The covering body 38 includes for example plastic, glass and/or metal. By way of example, the covering body 38 can be formed substantially from glass and include a thin metal layer, for example a metal film, and/or a graphite layer, for example a graphite laminate, on the glass body. The covering body 38 serves for protecting the conventional optoelectronic component 1, for example against mechanical force influences from outside. Furthermore, the covering body 38 can serve for distributing and/or dissipating heat generated in the conventional optoelectronic component 1. By way of example, the glass of the covering body 38 can serve as protection against external influences and the metal layer of the covering body 38 can serve for distributing and/or dissipating the heat that arises during the operation of the conventional optoelectronic component 1.

In various embodiments, the covering body 38 can correspond to the substrate 102 described. Alternatively, the covering body 38 can be fixed, for example adhesively bonded, on the substrate 102.

FIG. 3 illustrates a schematic sectional illustration concerning a method for producing an optoelectronic device 301 in accordance with various embodiments.

Figure 3A:
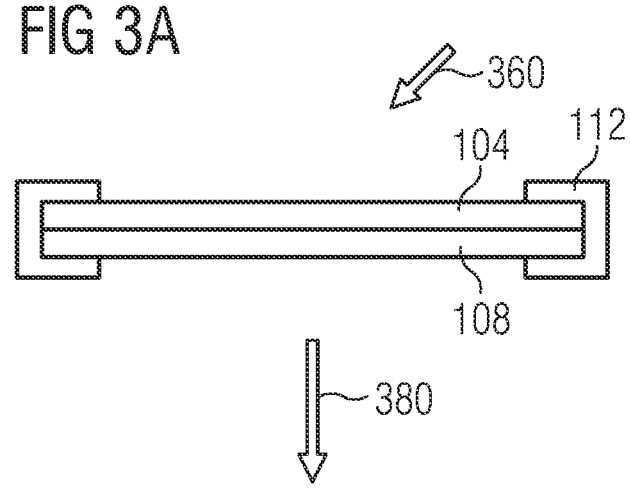
FIGS. 3A and 3B show schematic sectional illustrations concerning a method for producing an optoelectronic device in accordance with various embodiments.

FIG. 3A shows a precursor of the optoelectronic device 301 in the method for producing the optoelectronic device 301 in accordance with various embodiments. The optoelectronic device can correspond to one of the optoelectronic devices described above. The substrate, the shape memory material and the at least one optoelectronic component can be formed for example in accordance with one of the embodiments described in FIG. 1A to FIG. 1D and FIG. 2.

As is illustrated in FIG. 3a, the substrate 108 and the at least one optoelectronic component 104 formed thereon are stabilized by means of two clamps 112 at the outermost edge region at the planar or substantially planar substrate with the at least one optoelectronic component.

The substrate 108 is held or stabilized for example by means of the at least one clamp 112, for example two clamps, before the process of forming the at least one optoelectronic component 104 in the planar or in the substantially planar shape. In this case, after the process of forming the at least one optoelectronic component 104, the edge region of the substrate 108 that is covered by the clamps 112 remains free of optoelectronic components (not illustrated). This enables a stabilization—produced by mechanical clamping—of the substrate 108 in the planar or in the substantially planar shape. Alternatively or additionally, the substrate 108 with the at least one optoelectronic component formed thereon is provided with the at least one clamp 112, for example two clamps, in the outermost edge region of the substrate 108 with the at least one optoelectronic component formed thereon (illustrated in FIG. 3A). This enables a stabilization of the edge region of the substrate 108 with the at least one optoelectronic component formed thereon during the process of reshaping the substrate 108 into the third state or into a non-planar, for example convexly curved, shape. This has the effect that the reshaping can be carried out in a manner free of delamination or with a reduced delamination of the at least one optoelectronic component from the substrate.

The substrate 108 is for example an elastic substrate, a pseudoelastic substrate, a viscoelastic substrate and/or a thermoelastic substrate.

In various embodiments, the substrate 108 is free of shape memory material. Alternatively, the substrate 108 includes or is formed from a shape memory material. Alternatively or additionally, the substrate 108 includes a shape memory material that is arranged in the outermost edge region of the substrate.

In various embodiments, the at least one clamp 112 is free of shape memory material. Alternatively, the at least one clamp 112 includes or is formed from a shape memory material.

Figure 3B:
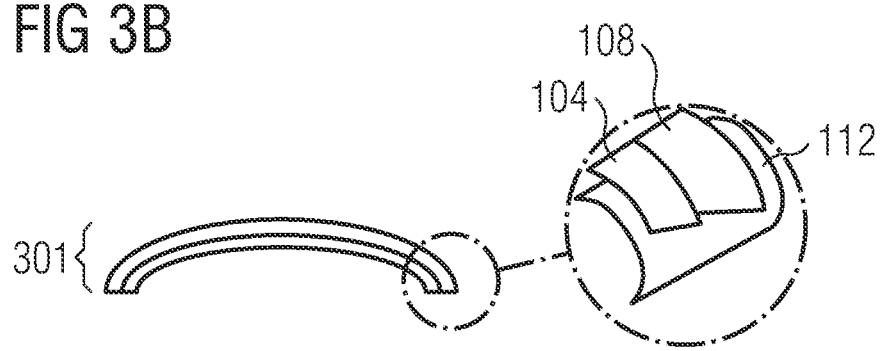

FIG. 3B illustrates the optoelectronic device 301 in the method for producing the optoelectronic device 301 in accordance with various embodiments. The optoelectronic device can correspond to one of the optoelectronic devices described above. The substrate, the shape memory material and the at least one optoelectronic component can be formed for example in accordance with one of the embodiments described above.

As is illustrated in FIG. 3B, the optoelectronic device 301 includes the substrate 108, the at least one optoelectronic component 104, for example a plurality of optoelectronic components. Furthermore, a clamp 112 is illustrated in the detailed view. The clamp 112 is arranged at the edge region of the substrate. The optoelectronic device 301 has a non-planar or a convexly curved shape.

In various embodiments, reshaping the substrate 108 including shape memory material into the third state is carried out, for example by means of removing the at least one clamp 112 from the substrate 108 and/or a stimulus. Alternatively or additionally, reshaping 380 the substrate 108 including shape memory material into the third state is carried out by means of removing the at least one clamp 112 from the substrate with the at least one optoelectronic component formed thereon and a stimulus. Alternatively or additionally, reshaping 380 the substrate 108 without shape memory material into the third state includes reshaping the at least one clamp 112. Alternatively or additionally, reshaping 380 the substrate 108 including shape memory material into the third state includes reshaping the at least one clamp 112 in a manner initiated by means of a stimulus and reshaping the substrate 108 in a manner initiated by means of a stimulus. In this case, the at least one clamp 112 includes or is formed from a shape memory material. The stimulus is for example an alteration of the value of a physical parameter or of a physical variable, for example the temperature, the wavelength of the UV light, the strength of the magnetic field or the mechanical stress, above a specifically defined value that initiates the phase transition or the phase transformation.

The at least one clamp including shape memory material makes it possible to support or stabilize the edge region of the optoelectronic device during the process of reshaping the substrate into the third state. This has the effect that a delamination of the at least one optoelectronic component from the substrate during the process of reshaping the substrate into the third state is reduced or decreased.

In one embodiment, the method for producing an optoelectronic device includes:
provautomatically a substrate including shape memory material, wherein the shape memory material is embossed with a permanent shape that is non-planar,
reshaping the substrate into a planar or substantially planar shape by means of rolling flat the substrate,
applying at least one optoelectronic component on the planar or substantially planar substrate, and
reshaping the substrate by means of a stimulus into a shape that is identical or substantially identical to the permanent shape of the shape memory material.

In one embodiment, the method for producing an optoelectronic device includes:

providing a substrate including shape memory material, wherein the shape memory material is embossed with a permanent shape that is non-planar,
reshaping the substrate into a planar or substantially planar shape by means of a clamping, for example by means of a releasable, mechanical connection, wherein the releasable, mechanical connection includes at least one clamp,
applying at least one optoelectronic component on the planar or substantially planar substrate, and
reshaping the substrate by means of a stimulus and releasing the clamping into a shape that is identical or substantially identical to the permanent shape of the shape memory material.

In one embodiment, the method for producing an optoelectronic device includes:
providing a substrate including shape memory material, wherein the shape memory material is embossed with a permanent shape that is non-planar,
reshaping the non-planar substrate into a planar or substantially planar shape by means of rolling flat,
applying at least one optoelectronic component on the planar or substantially planar substrate,
applying at least one elastic clamp, for example two clamps, at the edge region of the optoelectronic substrate with the at least one optoelectronic component,
reshaping the substrate of the optoelectronic device by means of a stimulus into a shape that is identical or substantially identical to the permanent shape of the shape memory material, and
removing the at least one clamp.

In one embodiment, the method for producing an optoelectronic device includes:
providing a substrate including shape memory material, wherein the shape memory material is embossed with a permanent shape that is non-planar,
reshaping the non-planar substrate into a planar or substantially planar shape by means of rolling flat,
applying at least one optoelectronic component on the planar or substantially planar substrate,
applying at least one clamp, for example two clamps, at the edge region of the optoelectronic device, wherein the at least one clamp includes a different shape memory material,
reshaping the substrate of the optoelectronic device by means of a stimulus into a shape that is identical or substantially identical to the permanent shape of the shape memory material, and simultaneously reshaping the at least one clamp by means of a stimulus, and
removing the at least one clamp.

In one embodiment, the method for producing an optoelectronic device includes:
providing an elastic substrate having a first non-planar shape,
reshaping the non-planar substrate into a planar or substantially planar shape by means of at least one clamp, wherein the at least one clamp includes a shape memory material that is embossed with a shape in such a way that the at least one clamp reshapes the optoelectronic device by means of a stimulus in such a way that the optoelectronic device has a non-planar shape,
applying at least one optoelectronic component on the planar or substantially planar substrate, and
reshaping the at least one clamp by means of a stimulus in such a way that the optoelectronic device has a second non-planar shape, which is identical or substantially identical to the first non-planar shape.

FIG. 4 shows a schematic sectional illustration concerning a method for producing an optoelectronic device in accordance with various embodiments.

The method 400 for producing the optoelectronic device 401 includes providing 420 a first substrate 102 and a second substrate 106. The first substrate 102 and the second substrate 106 have a non-planar shape in each case. The non-planar shape of the first substrate 102 is identical or substantially identical to the non-planar shape of the second substrate 106. In the process of providing 420 the first substrate 102 and the second substrate 106, the first substrate 102 and the second substrate 106 are in each case formed in the non-planar shape or brought to the non-planar shape, for example by means of a shape embossing.

The method 400 furthermore includes reshaping 440 the first substrate 102 and the second substrate 106 in each case into a planar or substantially planar shape. Reshaping 440 the first substrate 102 and the second substrate 106 from the first state into the second state includes mechanical reshaping, for example. By way of example, the mechanical reshaping includes drawing smooth and/or rolling. Drawing smooth can be a process of drawing the sides arranged at the outermost edge region of the first substrate 102 and of the second substrate 106. Rolling is rolling flat, for example.

The method 400 furthermore includes forming 460 at least one optoelectronic component 104 on the first substrate 102 having the planar shape or having the substantially planar shape or on the second substrate 106 having the planar shape or having the substantially planar shape. The at least one optoelectronic component is formed on a planar or planarized surface of the first or respectively second substrate. The at least one optoelectronic component 104 is formed in a sandwichlike manner between the first substrate 102 and the second substrate 106.

The method additionally includes reshaping 480 the first substrate 102 having the planar or substantially planar shape into a non-planar shape and reshaping 480 the second substrate 106 having the planar or substantially planar shape into a non-planar shape. The non-planar shape of the first substrate is identical or substantially identical to the non-planar shape of the second substrate. In this case, the non-planar shape of the first substrate and the non-planar shape of the second substrate in the completed device can be identical or substantially identical to the non-planar shape of the first substrate and of the second substrate in the process for providing 420 same.

This makes it possible to form the optoelectronic component 104 on a flat or planar surface of the first or respectively second substrate. This enables a process of forming 460 the optoelectronic component 104, wherein no or substantially no mechanical pressure, i.e. mechanical loading, is exerted on the optoelectronic component, for example on the active area of the optoelectronic component or the encapsulation layer thereof. This reduces or avoids the occurrence of damage and/or defects in the at least one optoelectronic component during the process of forming the latter on the substrate.

Furthermore, the arrangement of the at least one optoelectronic component 104 between the first substrate 102 and the second substrate 106 enables an optoelectronic device whose neutral axis lies in or in the region of the optoelectronic component. As a result, the at least one optoelectronic component is free of a deformation or compression or extension during the process of reshaping 380 the first substrate 102 and the second substrate 106 in each case into a non-planar shape. In other words: the method for producing the optoelectronic device 401 including two substrates makes it possible to produce the optoelectronic device 401 having a 3D or 2.5D appearance that is free of alterations of the appearance that the optoelectronic device has if it is formed in a flat fashion.

Figure 4A:
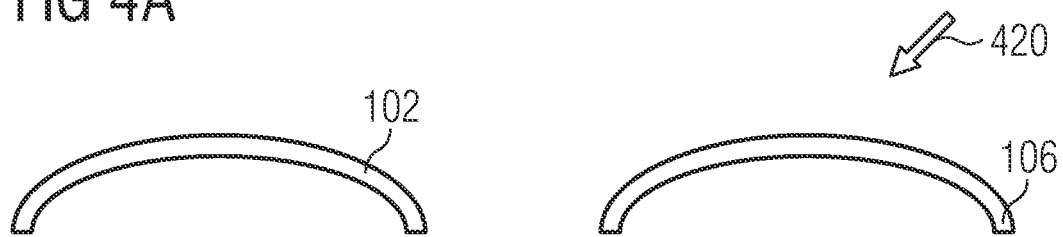

FIG. 4A shows a precursor of the optoelectronic device 401 in the method for producing the optoelectronic device 401 in accordance with various embodiments. The optoelectronic device can correspond to one of the optoelectronic devices described above. The first substrate 102, the second substrate 106, the shape memory material can be formed for example in accordance with a substrate described in FIG. 1A to FIG. 1D, FIG. 2, FIG. 3A, FIG. 3B.

Providing 420 the first substrate 102 and the second substrate 106 can be carried out in accordance with one of the embodiments described in FIG. 1A for providing 120 the substrate 102.

As is illustrated in FIG. 4A, the first substrate 102 and the second substrate 106 have a non-planar shape. The non-planar shape includes for example a bend or a curvature. By way of example, the non-planar shape is a convexly curved shape. The non-planar shape of the first substrate 102 can be identical or substantially identical to the non-planar shape of the second substrate 106.

In various embodiments, the first substrate 102 and the second substrate 106 include a shape memory material, wherein the shape memory material can be formed for example in accordance with one of the embodiments described in FIG. 1A to FIG. 1D, FIG. 2, FIG. 3A, FIG. 3B.

In various embodiments, providing 420 the first substrate 102 and the second substrate 106 includes forming the first substrate 102 and the second substrate 106 in the non-planar shape by means of shape embossing of the shape memory material respectively provided in the first substrate 102 and in the second substrate 106. In other words: the first substrate 102 and the second substrate 106 are shape-embossed into the non-planar shape. Said non-planar shape constitutes the permanent shape of the shape memory material of the respective first and second substrates.

Figure 4B:
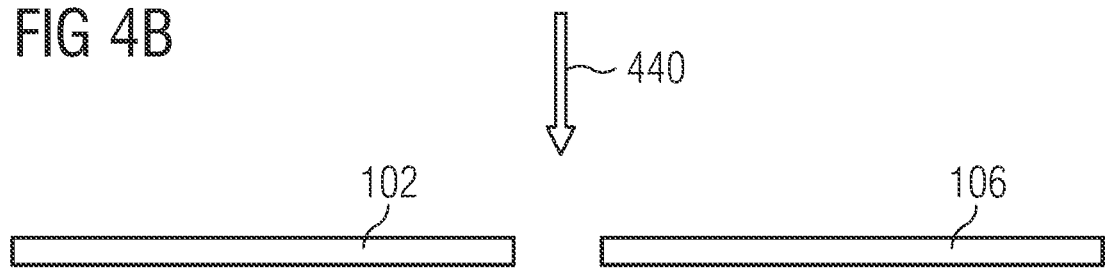

FIG. 4B shows a precursor of the optoelectronic device 401 in the method for producing the optoelectronic device 401 in accordance with various embodiments. The optoelectronic device can correspond to one of the optoelectronic devices described above. The first substrate 102, the second substrate 106, the shape memory material can be formed for example in accordance with one of the embodiments described in FIG. 1A to FIG. 1D, FIG. 2, FIG. 3A, FIG. 3B and FIG. 4A.

Reshaping 440 the first substrate 102 and the second substrate 106 into a planar shape can be carried out in accordance with one of the embodiments described in FIG. 1B for reshaping the substrate 102 from the first state into the second state.

As is illustrated in FIG. 4B, the first substrate 102 and the second substrate 106 have a planar or a substantially planar shape. The planar or substantially planar shape of the first substrate 102 and of the second substrate 106 constitutes the temporary shape or temporary form of the shape memory material of the respective first and second substrates. The temporary shape is obtained by means of the process of reshaping the first substrate 102 and the second substrate 106 from the non-planar shape into the planar or substantially planar shape. The temporary shape is the shape reversible to the permanent shape of the shape memory material of the respective first and second substrates.

Figure 4C:
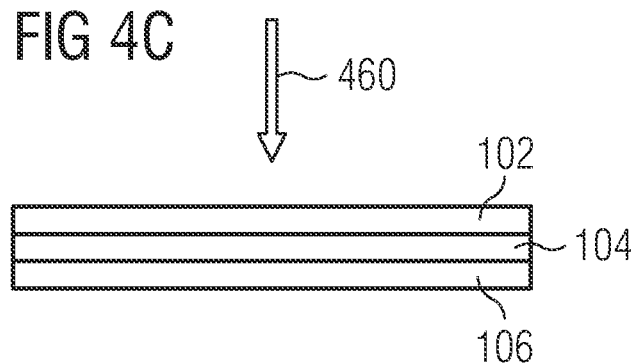

FIG. 4C shows a precursor of the optoelectronic device 401 in the method for producing the optoelectronic device 401 in accordance with various embodiments. The optoelectronic device can correspond to one of the optoelectronic devices described above. The first substrate 102, the second substrate 106, the shape memory material can be formed for example in accordance with one of the embodiments described in FIG. 1A to FIG. 1D, FIG. 2, FIG. 3A, FIG. 3B and FIG. 4A, FIG. 4B.

Forming 360 at least one optoelectronic component 104 can be carried out in accordance with one of the embodiments described in FIG. 1C and FIG. 3A for the process of forming 160 at least one optoelectronic component 104 on the substrate 102.

As is illustrated in FIG. 4C, at least one optoelectronic component 104, for example a plurality of optoelectronic components, is formed on the first substrate 102 or on the second substrate 106 and is arranged in a sandwichlike manner between the first substrate 102 and the second substrate 106.

This has the effect that the at least one optoelectronic component 104 is formed or applied on the first substrate 102 or on the second substrate 106 without a pressure that could damage the optoelectronic component 104 being imposed on the optoelectronic component 104 or on the active area of the optoelectronic component 104. This makes it possible, during the process of forming the at least one optoelectronic component 104, to prevent the previously occurring defects caused by pressure on the optoelectronic component 104 or on the active area of the optoelectronic component 104 during the process of forming same on the substrate.

Forming the at least one optoelectronic component 104 includes for example forming or applying at least one finished optoelectronic component on the first substrate 102 and/or on the second substrate 16, which is formed with or without an encapsulation layer. Forming the at least one optoelectronic component 104 can be carried out by means of lamination. Alternatively or additionally, the optoelectronic component 104 is formed for example in such a way that it is in physical contact with the first substrate 102 and/or with the second substrate 106. Alternatively or additionally, forming the at least one optoelectronic component 104 includes depositing a conductive layer on the first substrate 102 and/or on the second substrate 106. The conductive layer may include or form one of the electrodes of the optoelectronic component. Alternatively or additionally, forming the at least one optoelectronic component 104 includes at least forming the first electrode on the first substrate 102 or on the second substrate, forming the organic functional layer stack on the first electrode and forming the second electrode on the organic functional layer stack and applying the second substrate 106 or the first substrate 102 on the organic functional layer stack.

The second substrate 106 is for example cohesively connected to the at least one optoelectronic component. The cohesive connection is effected by means of an adhesive, for example. This makes it possible for the at least one optoelectronic component to be subjected to less stress during the process of reshaping the first substrate 102 and the second substrate 106.

In various embodiments, the encapsulation layer can be connected to the second substrate 106 in a force-locking manner. As a result, the encapsulation effect of the encapsulation layer is supported and the process of reshaping the first substrate and the second substrate into the third state will be stabilized.

Figure 4D:
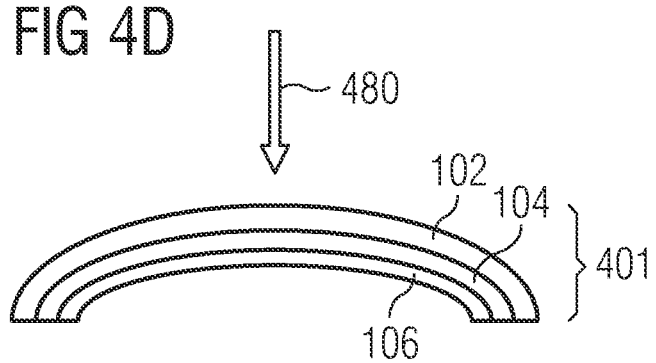

FIG. 4D illustrates the optoelectronic device 401 in the method for producing the optoelectronic device 401 in accordance with various embodiments. The optoelectronic device can correspond to one of the optoelectronic devices described above. The first substrate 102, the second substrate 106, the shape memory material can be formed for example in accordance with one of the embodiments described in FIG. 1A to FIG. 1D, FIG. 2, FIG. 3A, FIG. 3B and FIG. 4A to FIG. 4C.

Reshaping 480 the first substrate 102 and the second substrate 104 into the non-planar shape can be carried out in accordance with one of the embodiments described in FIG. 1D and FIG. 3B for the process of reshaping 180 the substrate 102 into the third state.

As is illustrated in FIG. 4D the optoelectronic device 401 includes the first substrate 102 having a first non-planar shape, the second substrate 106 having a second non-planar shape, and the at least one optoelectronic component 104, for example a plurality of optoelectronic components 104. The at least one optoelectronic component 104 is arranged in a sandwichlike manner between the first substrate 102 and the second substrate 106. The non-planar shape of the first substrate 102 is identical or substantially identical to the non-planar shape of the second substrate 106. The first substrate 102 is arranged in a coplanar fashion with respect to the second substrate 106. The first substrate 102 includes a first shape memory material. The second substrate 102 includes a second shape memory material. The first shape memory material can be identical to or different from the second shape memory material.

This has the effect that during the process of reshaping 480 the first substrate 102 and the second substrate 104 into the non-planar shape, the at least one optoelectronic component 106 includes or is formed from neutral axes. This enables the optoelectronic device that is produced by means of this method to be free of compression or extension.

In accordance with a first embodiment, a method for producing an optoelectronic device may include the following processes in the following order:
  providing a substrate, having a first state having a non-planar shape,
  reshaping the substrate into a second state, wherein the second state has a planar or substantially planar shape,
  forming at least one optoelectronic component on the substrate,
  reshaping the substrate into a third state,
  wherein the third state is identical or substantially identical to the first state.

In accordance with a second embodiment, the method in accordance with the first embodiment can be configured in such a way that the non-planar shape includes at least one curvature or one bend.

In accordance with a third embodiment, the method in accordance with the first or second embodiment can be configured in such a way that the substrate includes a shape memory material.

In accordance with a fourth embodiment, the method in accordance with the third embodiment can be configured in such a way that the shape memory material includes a metallic alloy or at least one polymer.

In accordance with a fifth embodiment, the method in accordance with the third to fourth embodiments can be configured in such a way that reshaping the substrate from the first state into the second state includes a phase transition of the shape memory material.

In accordance with a sixth embodiment, the method in accordance with the first to fifth embodiments can be configured in such a way that in the process of providing the substrate, the substrate is formed in a non-planar fashion, or the substrate is formed in a planar fashion and is brought to the non-planar shape, preferably by means of a shape embossing.

In accordance with a seventh embodiment, the method in accordance with the first to sixth embodiments can be configured in such a way that reshaping the substrate from the first state into the second state includes mechanical reshaping.

In accordance with an eighth embodiment, the method in accordance with the first to sixth embodiments can be configured in such a way that reshaping the substrate from the first state into the second state includes a fixing in the second state by means of a releasable, mechanical connection, preferably a clamping, and/or by means of at least one property of the shape memory material.

In accordance with a ninth embodiment, the method in accordance with the eighth embodiment can be configured in such a way that the releasable, mechanical connection includes at least one clamp, wherein the at least one clamp includes a shape memory material.

In accordance with a tenth embodiment, the method in accordance with the first to ninth embodiments can be configured in such a way that forming at least one optoelectronic component on the substrate includes a lamination of the at least one optoelectronic component on the substrate; and/or includes at least forming a first electrode on the substrate, forming an organic functional layer stack on the first electrode and forming a second electrode on the organic functional layer stack.

In accordance with an eleventh embodiment, the method in accordance with the eighth to tenth embodiments can be configured in such a way that reshaping the substrate from the second state into the third state includes releasing the releasable, mechanical connection and/or a further phase transition of the shape memory material, preferably by means of a stimulus.

In accordance with a twelfth embodiment, the method in accordance with the ninth to tenth embodiments can be configured in such a way that reshaping the substrate from the second state into the third state includes reshaping the at least one clamp including shape memory material, preferably by means of a stimulus.

In accordance with a thirteenth embodiment, the method in accordance with the first to twelfth embodiments can be configured in such a way that it furthermore includes after forming the at least one optoelectronic component on the substrate: forming an encapsulation layer, wherein forming the encapsulation layer and reshaping the substrate in the third state are carried out simultaneously.

In accordance with a fourteenth embodiment, the method for producing an optoelectronic device may include the following processes:
providing a first substrate and a second substrate, wherein the first substrate and the second substrate are formed in each case in a non-planar shape or are brought to the non-planar shape, preferably by means of a shape embossing,
reshaping the first substrate and the second substrate in each case to a planar or substantially planar shape,
forming at least one optoelectronic component on the first substrate having the planar shape or having the substantially planar shape or on the second substrate having the planar shape or having the substantially planar shape, wherein the at least one optoelectronic component is formed in a sandwichlike manner between the first substrate and the second substrate,
reshaping the first substrate having the planar shape or having the substantially planar shape and the second substrate having the planar shape or having the substantially planar shape in each case to a non-planar shape.

In accordance with a fifteenth embodiment, the optoelectronic device may include a first substrate having a first non-planar shape, wherein the first substrate includes a first shape memory material, a second substrate having a second non-planar shape, wherein the second substrate includes a second shape memory material, and at least one optoelectronic component, arranged in a sandwichlike manner between the first substrate and the second substrate, wherein the second non-planar shape is identical or substantially identical to the first non-planar shape and the first substrate is arranged in a coplanar or substantially coplanar manner with respect to the second substrate.

The invention is not restricted to the embodiments indicated. By way of example, it is possible to use a plurality of different optoelectronic components arranged alongside one another or one above another in the form of a display. By way of example, the method for producing the optoelectronic device may include further steps that make it possible to produce a 3D-shaped optoelectronic device including non-elastic bodies, for example to produce an optoelectronic device including a cylindrical body composed of shape memory material having rings of different sizes that allow the "development" into the cylindrical shape only in relation to the ring size used, for example in the lateral region.

LIST OF REFERENCE SIGNS 100, 400 Method
120, 140, 160, 180, 360, 380, 420, 440, 460, 480 Method processes
101, 301, 401 Optoelectronic device
12, 102, 106, 108 Substrate
1, 104 Optoelectronic component
112 Clamp
12 Carrier
14 Electrode layer
16, 18 Contact section
20, 23 Electrode
21 Electrical insulation barrier
22 Layer structure
24 Encapsulation layer
32 Contact region
36 Adhesion medium layer
38 Covering body While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:
1. A method for producing an optoelectronic device, the method comprising in the following order:
providing a substrate, having a first state having a non-planar shape,
reshaping the substrate into a second state by fixing the substrate in the second state by a releasable mechanical connection comprising at least one clamp, wherein the at least one clamp comprises a shape memory material,
wherein the second state has a planar or substantially planar shape,
forming at least one optoelectronic component on the substrate,
reshaping the substrate into a third state,
wherein the third state is identical or substantially identical to the first state.

2. The method of claim 1,
wherein the non-planar shape comprises at least one curvature or one bend.

3. The method of claim 1,
wherein the substrate comprises a second shape memory material.

4. The method of claim 3,
wherein the second shape memory material comprises a metallic alloy or at least one polymer.

5. The method of claim 3,
wherein reshaping the substrate from the first state into the second state comprises a phase transition of the second shape memory material.

6. The method of claim 1,
wherein, in the process of providing the substrate, the substrate is formed in a non-planar fashion.

7. The method of claim 1,
wherein, in the process of providing the substrate, the substrate is formed in a planar fashion and is brought to the non-planar shape.

8. The method of claim 7,
wherein, in the process of providing the substrate, the substrate is formed in a planar fashion and is brought to the non-planar shape by a shape embossing.

9. The method of claim 3,
wherein reshaping the substrate from the first state into the second state comprises a fixing in the second state by at least one property of the second shape memory material.

10. The method of claim 1,
wherein forming at least one optoelectronic component on the substrate comprises a lamination of the at least one optoelectronic component on the substrate.

11. The method of claim 1, further comprising:
at least forming a first electrode on the substrate, forming an organic functional layer stack on the first electrode and forming a second electrode on the organic functional layer stack.

12. The method of claim 3,
wherein reshaping the substrate from the second state into the third state comprises at least one of releasing the releasable, mechanical connection or a further phase transition of the second shape memory material.

13. The method of claim 1,
wherein reshaping the substrate from the second state into the third state comprises reshaping the at least one clamp.

14. The method of claim 1, further comprising:
after forming the at least one optoelectronic component on the substrate: forming an encapsulation layer, wherein forming the encapsulation layer and reshaping the substrate in the third state are carried out simultaneously.

15. The method of claim 1,
wherein the non-planar shape is a convexly curved shape.

* * * * *